(12) United States Patent
Thormundsson et al.

(10) Patent No.: US 10,103,694 B2
(45) Date of Patent: *Oct. 16, 2018

(54) AUDIO DRIVER SYSTEM AND METHOD

(71) Applicant: Synaptics Incorporated, San Jose, CA (US)

(72) Inventors: Trausti Thormundsson, Irvine, CA (US); Ragnar H. Jonsson, Laguna Niguel, CA (US); Vilhjalmur S. Thorvaldsson, Irvine, CA (US); James Walter Wihardja, Fullerton, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/842,775

(22) Filed: Sep. 1, 2015

(65) Prior Publication Data
US 2015/0372650 A1    Dec. 24, 2015

Related U.S. Application Data

(63) Continuation of application No. 13/166,600, filed on Jun. 22, 2011, now Pat. No. 9,124,219.
(Continued)

(51) Int. Cl.
*H03F 1/32* (2006.01)
*G10K 11/16* (2006.01)
(Continued)

(52) U.S. Cl.
CPC .......... *H03F 1/3247* (2013.01); *G10K 11/16* (2013.01); *H03F 1/26* (2013.01); *H03F 3/187* (2013.01);
(Continued)

(58) Field of Classification Search
CPC ........ H03F 1/3247; H03F 1/3264; H03F 1/26; H03F 3/187; H03F 2200/372;
(Continued)

(56) References Cited

U.S. PATENT DOCUMENTS 4,481,660 A * 11/1984 de Koning ............... H04R 3/12
330/124 R
4,495,640 A    1/1985 Frey
(Continued)

FOREIGN PATENT DOCUMENTS

EP         1798852    6/2007
KR    1020050052347    6/2005
(Continued)

OTHER PUBLICATIONS

European Patent Office; Supplementary European Search Report; European Application No. 10746794.6 filed Apr. 23, 2012.
(Continued)

*Primary Examiner* — Vivian Chin
*Assistant Examiner* — Douglas Suthers
(74) *Attorney, Agent, or Firm* — Haynes and Boone, LLP

(57) ABSTRACT

An audio driver equipped with a distortion compensation unit corrects for detected distortion and includes a digital to analog converter (DAC), an amplifier, and an output driver that drives a loudspeaker. Between the output driver and the loudspeaker, the audio driver can include a series resistor and a differential amplifier to measure the voltage across the resistor. A distortion detection unit can use the detected voltage to determine whether distortion, such as rub and buzz distortion is present. The distortion detection unit can comprise an analog to digital converter (ADC) to digitize the voltage data, an FFT to transform the voltage data into frequency information, a root-mean-square (RMS) module that measures the energy at each frequency, and an analysis
(Continued)

module which looks for the distortion signature in the energy spectrum.

1 Claim, 11 Drawing Sheets

Related U.S. Application Data

(60) Provisional application No. 61/360,720, filed on Jul. 1, 2010, provisional application No. 61/364,594, filed on Jul. 15, 2010, provisional application No. 61/364,706, filed on Jul. 15, 2010.

(51) Int. Cl.
*H03F 3/187* (2006.01)
*H03F 1/26* (2006.01)
*H03G 3/30* (2006.01)
*H03G 5/00* (2006.01)
*H03G 5/16* (2006.01)
*H03G 5/18* (2006.01)
*H03G 7/00* (2006.01)
*H03G 7/08* (2006.01)
*H03G 11/00* (2006.01)

(52) U.S. Cl.
CPC .......... *H03G 3/3026* (2013.01); *H03G 3/3089* (2013.01); *H03G 5/005* (2013.01); *H03G 5/165* (2013.01); *H03G 5/18* (2013.01); *H03G 7/002* (2013.01); *H03G 7/08* (2013.01); *H03G 11/008* (2013.01); *H03F 2200/372* (2013.01); *H03F 2200/411* (2013.01); *H03F 2200/516* (2013.01); *H03F 2200/78* (2013.01)

(58) Field of Classification Search
CPC .......... H03F 2200/411; H03F 2200/516; H03G 7/002; H03G 3/3026; H03G 3/3089; H03G 5/005; H03G 5/165; H03G 5/18; H03G 7/08; H03G 11/008; G10K 11/16

USPC ... 381/55, 71.11, 56, 58, 59, 96, 71.12, 94.8
See application file for complete search history.

(56) References Cited

U.S. PATENT DOCUMENTS

| | | | |
|---|---|---|---|
| 5,528,695 | A | 6/1996 | Klippel |
| 6,058,195 | A | 5/2000 | Klippel |
| 6,201,873 | B1 | 3/2001 | Farra |
| 6,535,846 | B1 | 3/2003 | Shashoua |
| 2002/0159605 | A1 | 10/2002 | Yoshino et al. |
| 2004/0071299 | A1 | 4/2004 | Yoshino |
| 2005/0276425 | A1 | 12/2005 | Forrester et al. |
| 2007/0160221 | A1* | 7/2007 | Pfaffinger ............ H04R 29/001 381/59 |
| 2008/0152168 | A1 | 6/2008 | Magrath |
| 2011/0228945 | A1* | 9/2011 | Mihelich ................ H04R 3/002 381/59 |

FOREIGN PATENT DOCUMENTS

| | | |
|---|---|---|
| KR | 1020050098113 | 10/2005 |
| WO | WO 2007/076299 | 7/2007 |

OTHER PUBLICATIONS

European Patent Office; International Search Report and Written Opinion; PCT Application No. PCT/US2011/044068 filed Dec. 9, 2011.

European Patent Office; International Search Report and Written Opinion; PCT Application No. PCT/US2011/044242 filed Jan. 26, 2012.

Klippel, Wolfgang; Measurement of Impulsive Distortion, Rub and Buzz and other Disturbances; 114th Convention of the AES; Mar. 22, 2003 (10 pages).

Korean Intellectual Property Office; International Search Report and Written Opinion; PCT Application No. PCT/US2010/025282 filed Oct. 13, 2010.

* cited by examiner

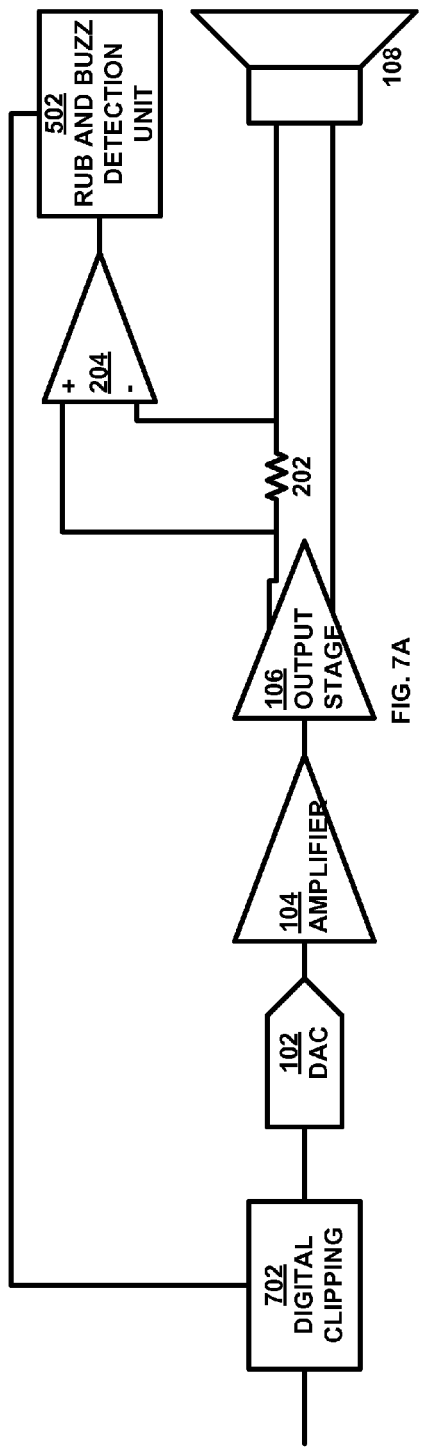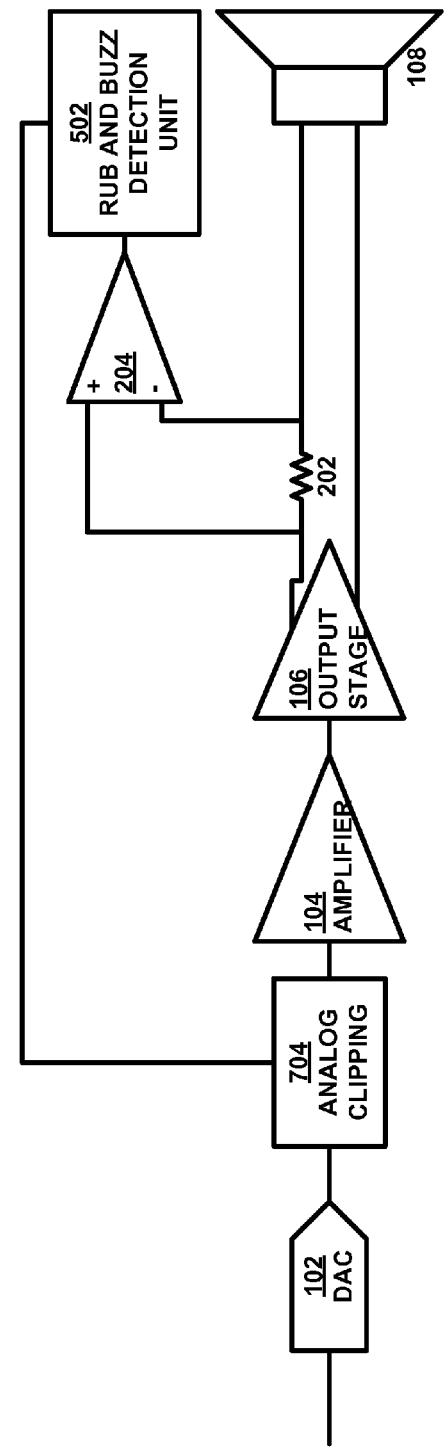

AUDIO DRIVER SYSTEM AND METHOD

RELATED APPLICATIONS

This application is a continuation of U.S. patent application Ser. No. 13/166,600, filed Jun. 22, 2011, which claims priority to U.S. Provisional Patent Application No. 61/360,720, filed Jul. 1, 2010, which is hereby incorporated by reference for all purposes, and U.S. Provisional Patent Application No. 61/364,594, filed Jul. 15, 2010; and U.S. Provisional Patent Application No. 61/364,706, filed Jul. 15, 2010.

TECHNICAL FIELD

This disclosure relates to generally to audio drivers, and more specifically to a current feedback mechanism for distortion removal, microphone operation and noise cancellation.

BACKGROUND

Loudspeakers are susceptible to a variety of forms of distortion, which can be irritating to a listener. For example, distortion in loudspeakers in cell phones can lead not only to poor quality reproduction, but can be so bad that the speech is unintelligible. With the movement towards smaller and cheaper loudspeakers in today's consumer electronics, the problem is exacerbated.

At present, loudspeakers are measured for distortion in the factory, if at all, and those that don't meet specifications are simply discarded. In other audio disciplines, small microphones are used to measure noise in noise canceling applications.

SUMMARY

Current flowing between a loudspeaker and an output driver in an audio driver contains the encoded audio signal being driven to the loudspeaker, and also contains sound signals received at the loudspeaker. Among the sound information received can include distortion, external noise, and external sound. An audio driver can be equipped with a distortion compensation unit that can correct for distortion once it is detected, in addition to a digital to analog converter (DAC), an amplifier, and an output driver that drives the loudspeaker. Between the output driver and the loudspeaker, the audio driver can include a series resistor, and a differential amplifier can be used to measure the voltage across the resistor. A distortion detection unit can use the detected voltage to determine whether distortion is present. For example, rub and buzz distortion has a specific spectral signature. The distortion detection unit in this case can comprise an analog to digital converter (ADC) to digitize the voltage data, an FFT to transform the voltage data into frequency information, a root-mean-square (RMS) module that measures the energy at each frequency, and an analysis module which looks for the distortion signature in the energy spectrum.

Once distortion is detected a number of compensation techniques can be used to compensate for the distortion, including dynamic range compression, phase modification, dynamic gain control and clipping.

In another exemplary embodiment, the audio driver can include an adaptive filter to remove the transmitted audio signal from the differential voltage across the series resistor, leaving only a signal corresponding to external sound in the voltage data. This voltage data can then be used as input audio data. In this manner, the loudspeaker functions both as a loudspeaker and a microphone in full duplex.

In another embodiment, the external sound left in the voltage data can be treated as noise. The voltage data is then sent to a noise canceller, which generates a noise cancellation signal that can be injected into the transmitted audio signal, thereby cancelling the external noise.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIG. 7A is a diagram of an audio driver which uses digital clipping to compensate for rub and buzz distortion in accordance with an exemplary embodiment of the present invention;

FIG. 7B is a diagram of an audio driver which uses an analog clipping circuit to compensate for rub and buzz distortion in accordance with an exemplary embodiment of the present invention;

DETAILED DESCRIPTION OF THE INVENTION

Figure 1:
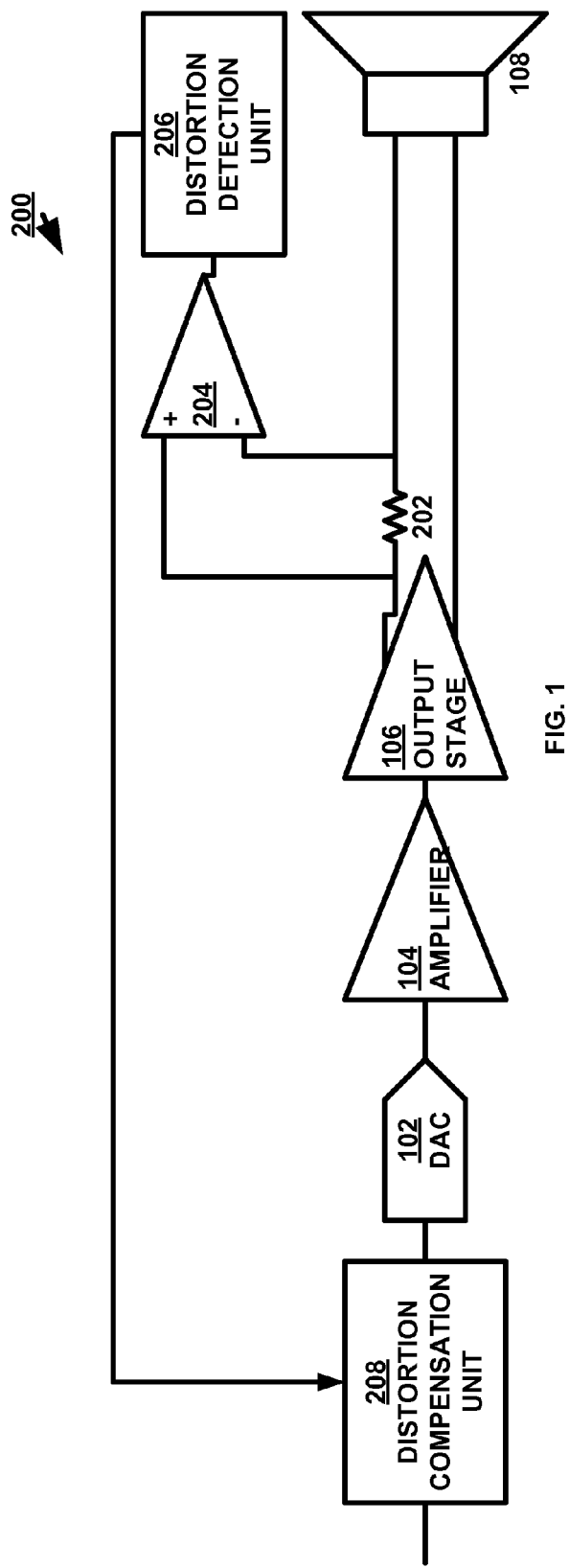
FIG. 1 is a diagram of an audio system with distortion detection in accordance with an exemplary embodiment of the present invention.

In the description that follows, like parts are marked throughout the specification and drawings with the same reference numerals. The drawing figures might not be to scale and certain components can be shown in generalized or schematic form and identified by commercial designations in the interest of clarity and conciseness.

FIG. 1 is a diagram of an audio system 200 with distortion detection in accordance with an exemplary embodiment of the present invention. System 200 can be implemented in hardware or a suitable combination of hardware and software, and can be one or more discrete or integrated electronics components. As used herein, and by way of example and not by limitation, "hardware" can include a combination of discrete components, an integrated circuit, an application-specific integrated circuit, a field programmable gate array, a general purpose processing or server platform, or other suitable hardware. As used herein and by way of example and not by limitation, "software" can include one or more objects, agents, threads, lines of code, subroutines, separate software applications, one or more lines of code or other suitable software structures operating in one or more software applications or on one or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

System 200 includes resistor 202, which is connected in series with output stage 106 and loudspeaker 108. The voltage developed across resistor 202 is proportional to the current going to the loudspeaker. When distortion is present, it can be detected in the voltage developed across resistor 202. For example, "rub and buzz" distortion causes a distortion characterized by the presence of high order harmonics. Therefore, if high order harmonics are detected in the voltage across resistor 202, the presence of "rub and buzz" distortion can be inferred. The voltage can be measured by the use of differential amplifier 204.

Audio system 200 further comprises distortion detection unit 206 and distortion compensation unit 208. Distortion detection unit 206 looks for the signature of one or more types of distortion. When distortion is detected, it sends a signal to distortion compensation unit 208 which can alter the audio signal traveling to DAC 102. Alternatively, distortion compensation unit could perform distortion compensation in analog by being placed after DAC 102.

In one embodiment of the invention, multiple distortion detection units are employed with corresponding distortion compensation units. Each detection and compensation pair is designed to address one type of distortion. For example, one distortion detection unit could be designed to detect rub and buzz distortion and another distortion detection unit could be designed to detect rattle distortion.

Figure 2:
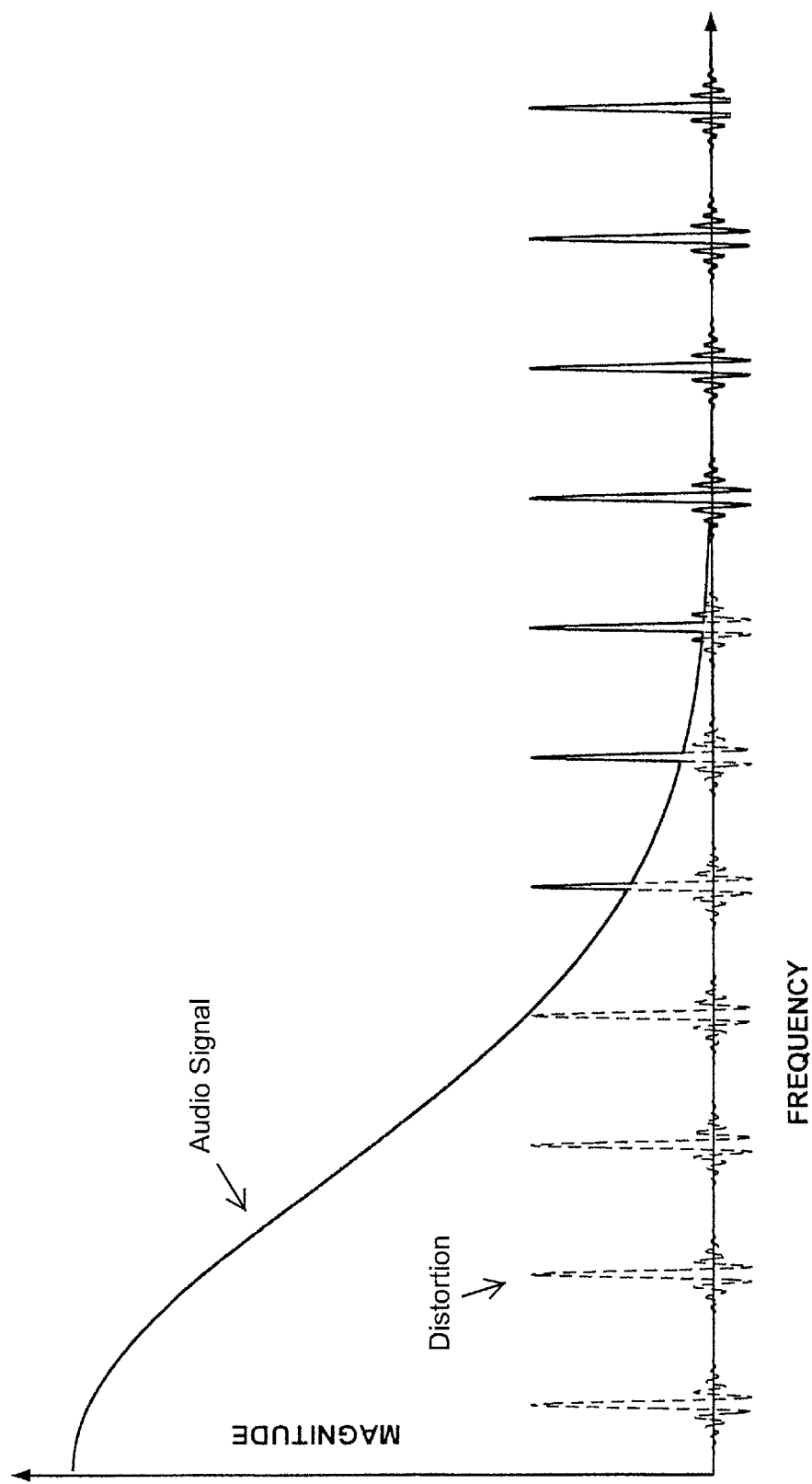
FIG. 2 is an exemplary spectrum of loudspeaker output experiencing rub and buzz distortion.

FIG. 2 is an exaggerated spectrum of loudspeaker output experiencing rub and buzz distortion. Typically, when the rub and buzz distortion occurs it manifests itself as an impulse train in the time domain which translates to an impulse train in the frequency domain. The distortion is shown with the dotted lines. As seen in the diagram, the low order harmonics of the distortion may have a substantially lower magnitude than the audio signal. However, the distortion also, exhibits impulses at higher order harmonics where the audio signal is weaker. This may be one of the reasons, rub and buzz distortion is irritating to the listener, but it is also method of detecting the characteristics of rub and buzz distortion.

Figure 3:
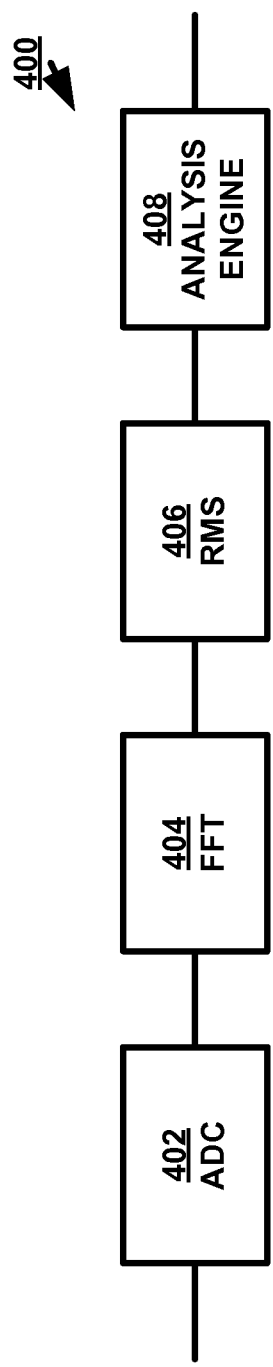
FIG. 3 is a diagram of a rub and buzz distortion detection unit in accordance with an exemplary embodiment of the present invention.

As an example, FIG. 3 is an embodiment of a rub and buzz distortion detection unit. Rub and buzz distortion detection unit 400 comprises analog to digital converter (ADC) 402, fast Fourier transform (FFT) module 404, root mean square (RMS) power module 406 and analysis engine 408. ADC 402 converts the voltage to a digital value. FFT module 404 converts the voltage received by ADC 402 into frequency domain. RMS power module 406 measures or estimates the power at each frequency. Analysis engine 408 detects impulse trains and reports the occurrence of rub and buzz distortion to distortion compensation unit 208.

Figure 4:
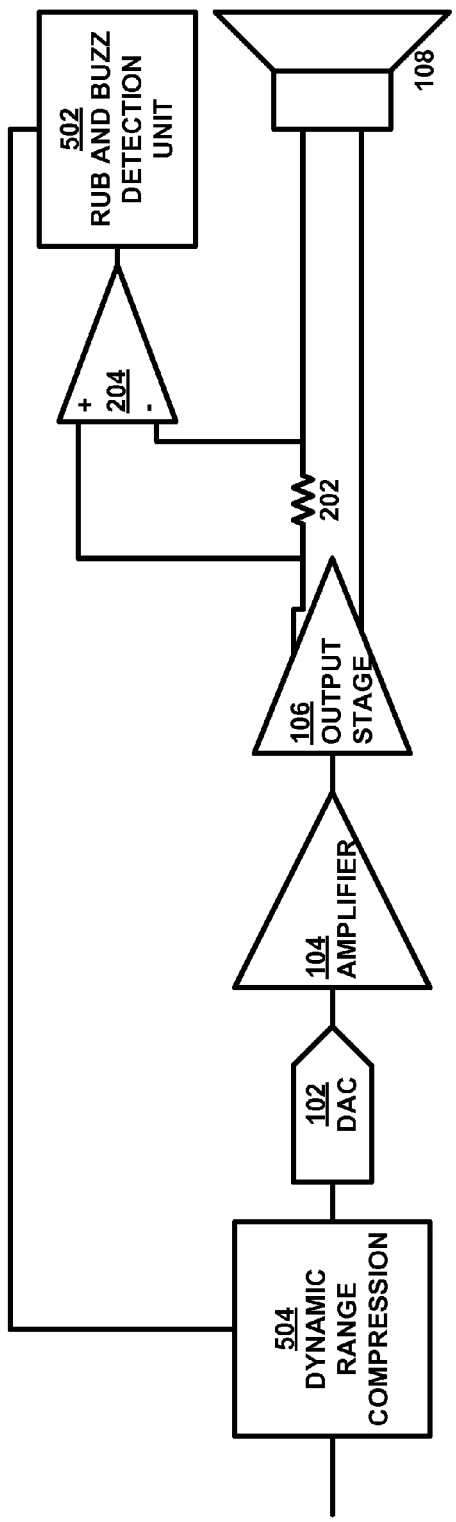
FIG. 4 is a diagram of an audio driver with rub and buzz compensation in accordance with an exemplary embodiment of the present invention.

When experiencing rub and buzz distortion there are a number of compensation techniques available. These techniques are described in more detail in U.S. Patent Application No. 61/290,001 which is hereby incorporated by reference. As an example, FIG. 4 illustrates an audio driver with rub and buzz compensation. In this example, the distortion detection unit is rub and buzz detection unit 502 which can be implemented, for example, by rub and buzz detection unit 400. The distortion compensation unit is dynamic range compression module 504. Dynamic range compression module 504 compresses the dynamic range of the audio signal by shifting the phase of various frequency components.

Figure 5:
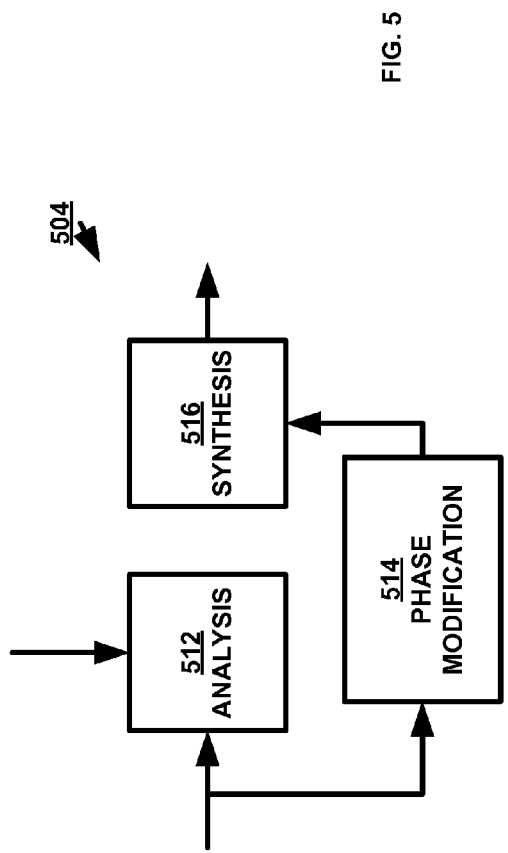
FIG. 5 is a diagram of an embodiment of a dynamic range compression module for speech in accordance with an exemplary embodiment of the present invention.

FIG. 5 is a diagram illustrating one embodiment of a dynamic range compression module when dealing with speech. This example of dynamic range compression module 504 comprises analysis module 512, phase modification module 514, and synthesis module 516. The speech based phase modification approach breaks down the audio signal into tracks. Human speech can be modeled as a plurality of tracks which have a frequency, an amplitude and phase associated with it. Analysis module 512 subdivides a signal into frames and determines the frequency, amplitude and phase of each track over the frame. Phase modification module 514 using the frequency, amplitude and phase information of each track determines an optimal phase for each track in order to minimize the peak amplitude. Across the frame, the frequency, amplitude and optimal phase are interpolated. These revised values are then used by synthesis module 416 to construct a new audio signal which has a lower peak amplitude.

Figure 6:
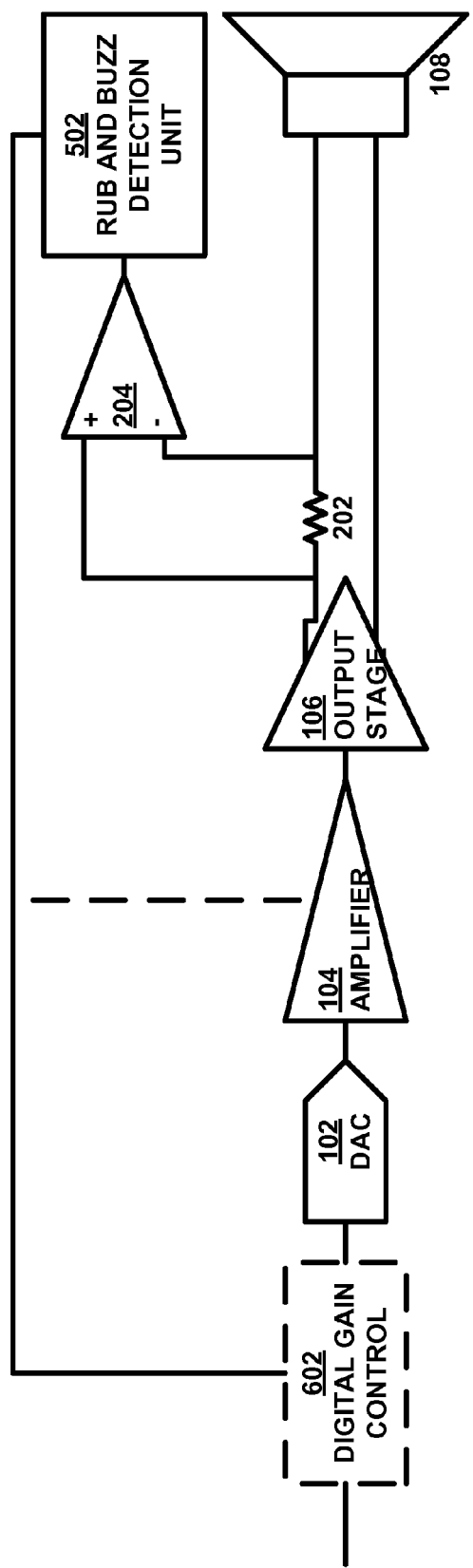
FIG. 6 is a diagram of an audio driver which uses gain control to compensate for rub and buzz distortion in accordance with an exemplary embodiment of the present invention.

An alternative compensation approach is shown in FIG. 6 which uses gain control to compensate for rub and buzz distortion. In one embodiment, rub and buzz detection unit 502 adjusts the gain of amplifier 104 whenever rub and buzz distortion is detected. That is when rub and buzz distortion is detected the gain of amplifier 104 is reduced until no rub and buzz distortion is detected. In an alternate embodiment, gain adjustment is performed by digital gain control module 602 preceding DAC 102. Whenever rub and buzz distortion is detected digital gain control module 602 attenuates the audio signal digitally until no rub and buzz distortion is detected.

Another method to compensate for rub and buzz distortion is to clip the signal above a fixed threshold. FIG. 7A illustrates an embodiment where the audio driver comprises digital clipping module 702 which clips each digital value to a maximum magnitude. If rub and buzz detection unit 502 detects distortion, then the fixed threshold is decreased until no rub and buzz distortion id detected. FIG. 7B illustrates an alternate embodiment of an audio driver where the clipping is performed in the analog domain by analog clipping circuit 704. Whenever rub and buzz detection unit 502 detects distortion it reduces the clipping threshold on analog clipping circuit 704.

Figure 8:
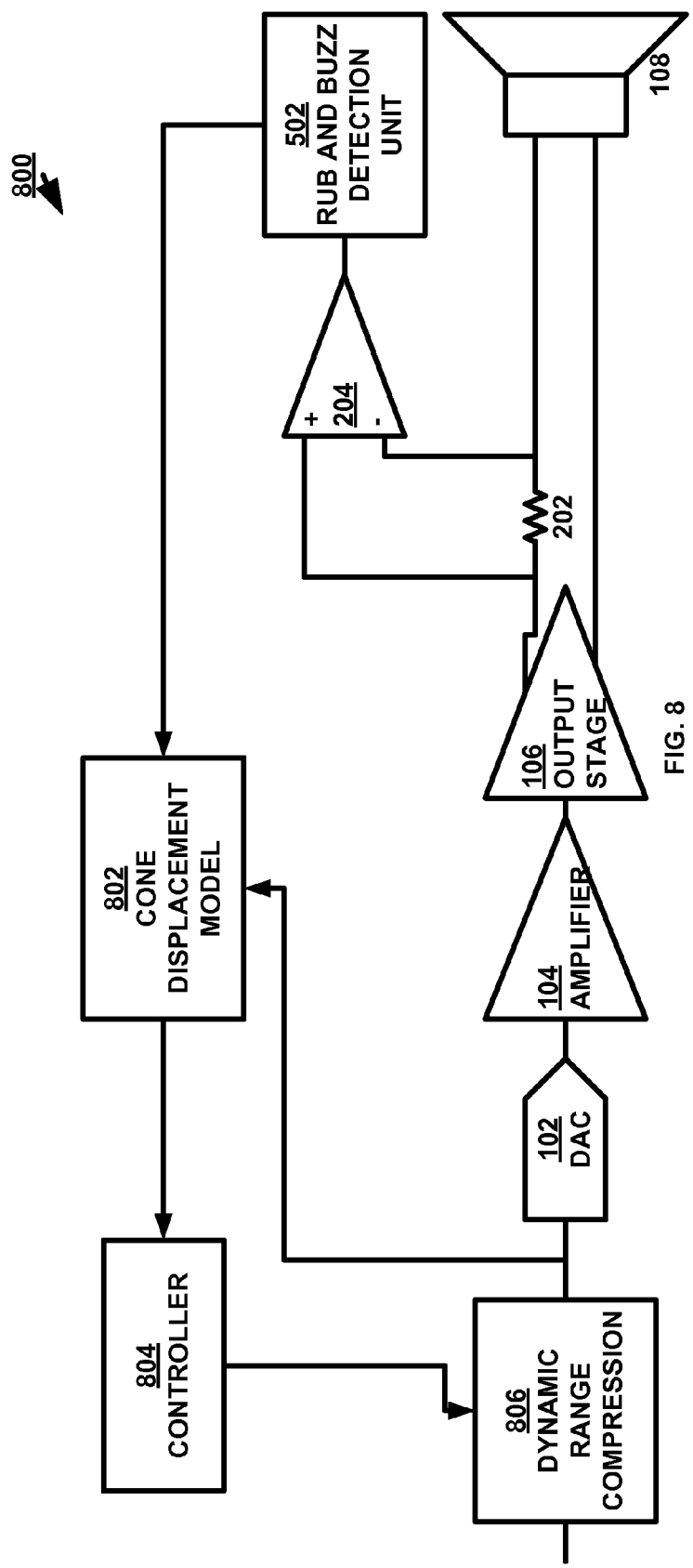
FIG. 8 is a diagram of an audio driver system having a feed forward and feedback distortion compensation mechanism in accordance with an exemplary embodiment of the present invention.
Figure 9:
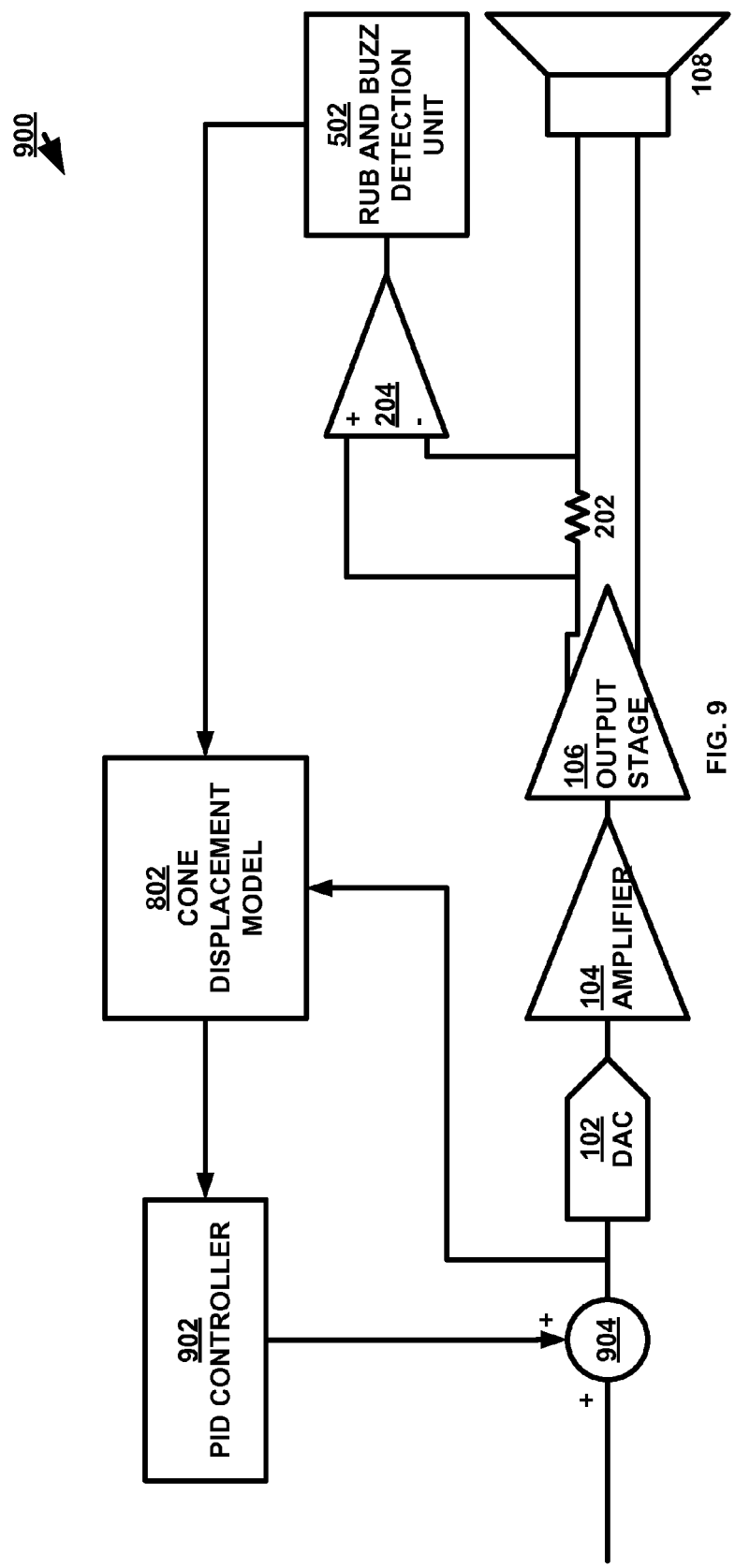
FIG. 9 is a diagram of an audio driver using a cone displacement model in accordance with an exemplary embodiment of the present invention.
Figure 10:
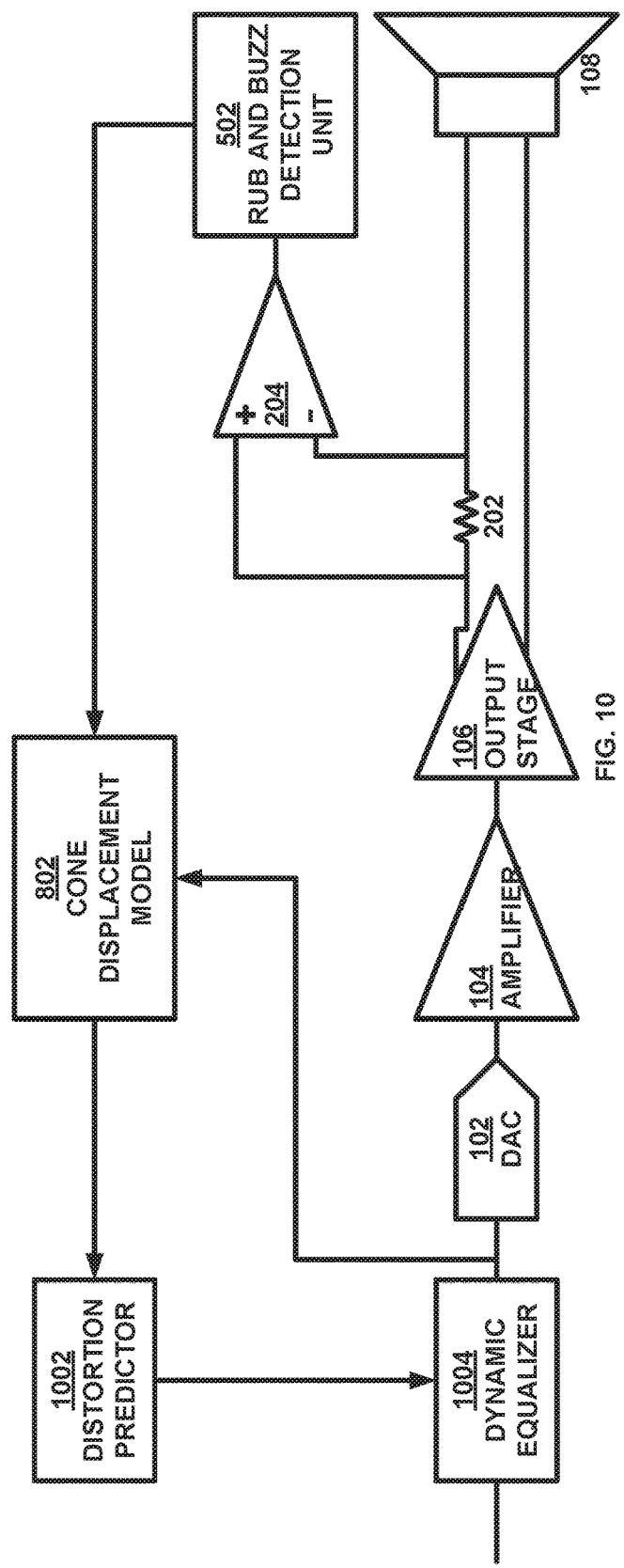
FIG. 10 is a diagram of an audio driver with a cone displacement model in accordance with an exemplary embodiment of the present invention.

One difficulty with these feedback only techniques is that the distortion detection unit can detect distortion and reduce the peak signal values, however, the audio driver cannot easily increase the maximum peak values without risk of encountering distortion again. FIGS. 8-10 show an audio driver system having a model based feed forward distortion compensation mechanism.

FIG. 8 shows an audio driver system having a feed forward and feedback distortion compensation mechanism. Cone displacement model 802 models the displacement of the code as a function of the output signal. Cone displacement model 802 can receive a digital audio signal, an analog audio signal between DAC 102 and amplifier 104 or an analog audio signal after amplifier 104. If amplifier 104 has adjustable gain, cone displacement model 802 would have to also receive the gain value. As shown in FIG. 8, cone displacement model 802 receives the digital audio signal. The model predicts the displacement of the loudspeaker cone at any given time. If the prediction yields a displacement that the cone would hit the magnetic coil or displace beyond its acceptable limits controller 804 adjusts dynamic range compression module 806 to appropriately compress the dynamic range of the audio signal to prevent rub and buzz distortion.

The problem with simply using a cone displacement model is that even if the model is properly calibrated in the factory. As the loudspeaker ages, the displacement characteristics changes, so rub and buzz distortion ultimately can occur because the cone displacement model is out of date with the aging of the loudspeaker. Fortunately, rub and buzz detection unit 502 can detect rub and buzz distortion and adjust the cone displacement model to account for the aging of the loudspeaker. As the loudspeaker ages, the cone displacement model can be refined to account for the changing loudspeaker characteristics. In alternate embodiments, gain adjustment similar to that of FIG. 6 and clipping similar to that of FIGS. 7A and 7B can be applied in addition to or in lieu of dynamic range compression.

FIG. 9 shows an alternate embodiment of an audio driver using a cone displacement model. Like the system 800, system 900 uses a cone displacement model, e.g., cone displacement model 802. The cone displacement model provides an error signal to proportional-integral-derivative (PID) controller 902. The error signal is the maximum of the difference between the cone displacement generated by the model and a set threshold and zero. The set threshold should be a limit to the maximum allowed cone displacement. The set threshold can be the maximum allowable before the cone hits the magnetic coil or a displacement which causes rub and buzz from a different source. However, it can also be a limit less than the maximum in order to insure some margin in the even there are some errors in the model or simply to allow for a little more margin for error generally.

PID controllers are well known in the art for providing a feedback mechanism to adjust a process variable, which in this case is the error signal described above, to a particular set point, which in this case is zero. The proportional coefficient, P, integral coefficient, l, and derivative coefficient D are used to adjust the PID controller in response to the current error, accumulated past error and predicted future error, respectively.

As an example, mathematically denote the output of cone displacement model 802 as y[n] then the error is expressed as e[n]=max(y[n]−s,0), where s is displacement where distortion takes place. Then, the output of PID controller u[n] can be expressed by the following equation:

$$u[n] = u[n-1] + \underbrace{P(e[n]-e[n-1])}_{Proportional} + \underbrace{I(e[n])}_{Integral} + \underbrace{D(e[n]-2e[n-1]+e[n-2])}_{Derivative}$$

or by the alternate formula:

$$u[n]=A(u[n-1]+P(e[n]-e[n-1])+I(e[n])+D(e[n]-2e[n-1]+e[n-2]))$$

Where A is a scaling factor such as 0.999. In another embodiment, the control signal u[n] can be filtered to smooth out the signal.

As denoted above, the P coefficient, l coefficient, and the D coefficient control how fast the system responds to the current, accumulated past, and predicted future error respectively. The choice of these coefficients control the attack, release and settling time of the controller. Furthermore, the coefficients further define the frequency range of the control signal, the PID is tuned such that it generates a correction signal that comprises of frequencies defined by the rub-and-buzz region of the loudspeaker. Other adaptation or optimization algorithms can be used to tune the PID controller. It should also be noted that because the process variable is always non-negative, the integral term can accumulate, therefore, some adjustment to the integral term should be periodically made so that the integral term does not overly dominate the PID controller over time.

Based on the error signal and the P, l and D coefficients, the PID controller generates a control signal which is added to the audio signal by adder 902. The control signal is adjusted by the PID controller to drive the error signal received to zero. Once again the feedback mechanism using the PID controller is only as effective as the cone displacement model. As mentioned before the loudspeaker ages, the characteristics of loudspeaker change. Fortunately, with a feedback mechanism of rub and buzz detection unit 502, actual distortion can be detected. When actual distortion is detected, rub and buzz detection unit 502 signals cone displacement model 802 which can make an adjustment. The adjustment can be as simple as changing the set threshold. For example, as a loudspeaker ages, a smaller displacement could be sufficient to cause rub and buzz, so as cone displacement model 802 receives feedback that rub and buzz distortion is taking place, it can lower the set threshold until the rub and buzz distortion is gone.

FIG. 10 illustrates yet another embodiment of an audio driver with a cone displacement model. In this embodiment, cone displacement model 802 provides a cone displacement value to distortion predictor 1002. Based on the analysis performed by distortion predictor 1002, dynamic equalizer 1004, such as one disclosed in U.S. patent application Ser. No. 12/712,108, can selectively attenuate certain frequency bands to reduce the overall cone displacement. In one variant, distortion predictor 1002 can be a PID controller which sends a control signal which dynamic equalizer 1004 uses as a basis for adjusting the attenuation of certain frequency bands.

One added benefit of this configuration is that while dynamic equalizer 1004 can be used to attenuate certain frequency bands to eliminate rub and buzz distortion, the rub and buzz distortion can be attenuated, certain frequency bands can actually be accentuated by applying gain without introducing rub and buzz distortion. By increasing the magnitude of certain frequency bands, the listener perceives a louder sound without rub and buzz distortion.

Figure 11:
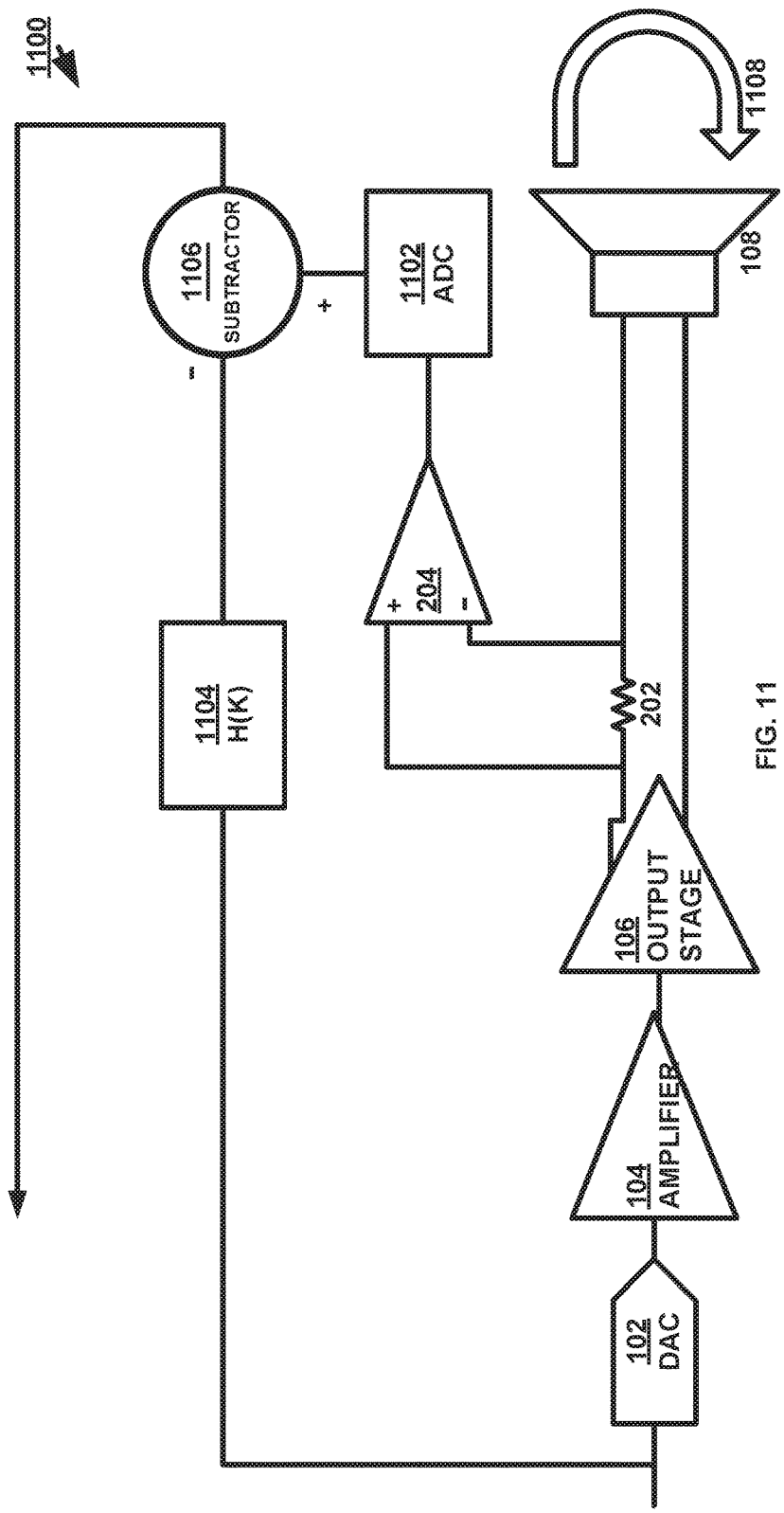
FIG. 11 is a diagram of a system which functions both as an audio driver and an audio receiver in accordance with an exemplary embodiment of the present invention.

FIG. 11 shows a system which functions both as an audio driver and an audio receiver. System 1100 has similar components to audio driver 200 with DAC 102, amplifier 104, output stage 106, resistor 202 and differential amplifier 204. Loudspeaker 108 functions both as a loudspeaker and a microphone. As a microphone, loudspeaker 108 can pick up sounds from the surrounding environment. In system 1100, the voltage measured across resistor 202 is digitized using ADC 1102 and comprises both the digitized representation of the external sounds and the sound driven out by output loudspeaker 108. Essentially, the problem becomes removing a known signal x(n) which may be transformed by an unknown process with a transfer function having impulse response s(k) from a combined signal y(n)=(s*x)(n)+d(n), where d(n) is the desired input signal and * represents convolution.

The problem is very similar to echo cancellation. Echo cancellation is a widely studied field and one of ordinary skill in the art can find numerous echo cancellation techniques that can be applied to system 1100. One such approach is the use of a linear adaptive filter such as adaptive filter 1104 shown. Adaptive filter 1104 has a time varying impulse response h(k,n) and can be used to cancel (s*x)(n) by generating a cancellation signal which is subtracted by subtractor 1106. This leaves d(n) the audio signal generated by the external sound. In addition to removing variants of the known outgoing signal. This system has the added benefit of cancelling any echo (e.g., echo 1108) which may be experienced by loudspeaker 108. Numerous known adaptation techniques can be employed with the linear adaptive filter.

Figure 12:
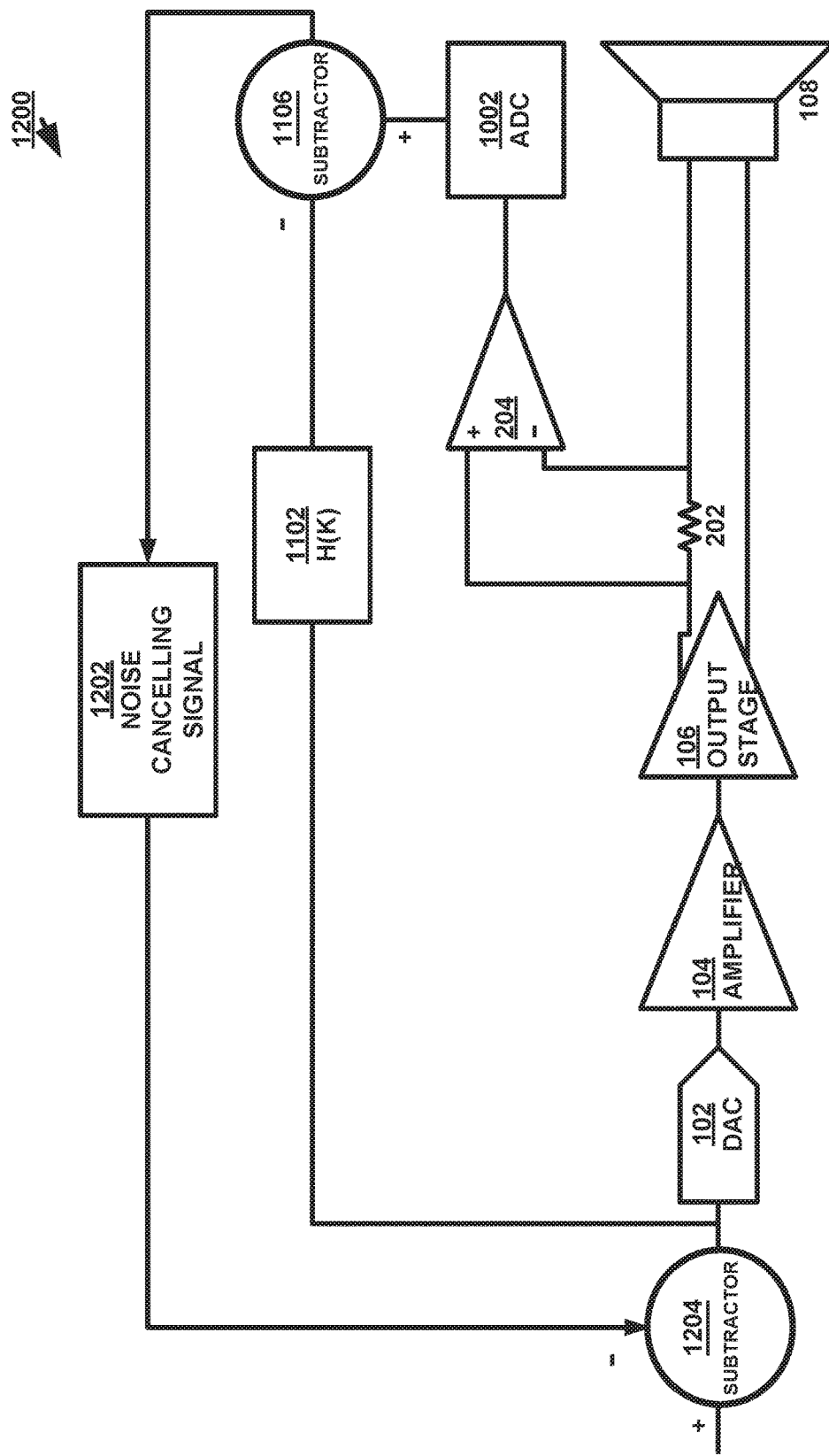
FIG. 12 is a diagram of an audio driver system which can be used to eliminate environmental background noise from a listener in accordance with an exemplary embodiment of the present invention.

FIG. 12 shows an audio driver system which can be used to eliminate environmental background noise from a listener. Once system 1200 removes the outgoing signal from the voltage across resistor 202 using adaptive filter 1104 and ADC 1102, the digital signal remaining is representative of the external sounds perceived in the environment. If loudspeaker 108 were enclosed in a pair of headphones, the external sounds would be considered undesirable background noise. Based on the detected background noise determined by subtracting the output of linear adaptive filter 1102 from ADC 1004 by subtractor 1106, noise cancellation module 1202 can generate a cancellation signal that is subtracted from the outgoing signal by subtractor 1204 so the result is that signal transmitted by loudspeaker 108 destructively interferes with the background noise resulting in cancellation of the external noise.

Noise cancellation module 1202 can employ any of the noise cancellation technique available. For example, noise cancellation techniques used are widely available in the field of active noise reduction. As an example, Kuo, et al., (M. Kuo and D. R. Morgan, Active Noise Control Systems: Algorithms and DSP Implementation, John Willey & Sons, New York, N.Y., USA, 1996) teaches many of these techniques and is incorporated by reference.

By employing an audio driver equipped with system 1200, an audio driver built into a PC audio card, MP3 player, portable DVD player or other audio playback device can be equipped with noise cancellation capabilities. This enables those audio devices to provide noise cancellation with standard headphones eliminating the need for expensive noise cancelling head phones. In addition, the end user can employ headphones of his choosing. By using system 1200, noise cancellation is moved from the headphones where it is typically implemented to the playback device.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. An audio driver comprising:
    a digital to analog converter (DAC) operable to convert a digital audio signal into an analog audio signal;
    an amplifier operable to receive the analog audio signal and produce an amplified analog audio signal;
    an output driver operable to drive a loudspeaker with the amplified analog audio signal;
    a resistor placed in series between the output driver and the loudspeaker;
    a differential amplifier operable to measure a voltage signal across the resistor;
    an analog to digital converter (ADC) operable to digitize the voltage signal across the resistor;
    an adaptive filter operable to approximate the digital audio signal and remove the digital audio signal from the output of the ADC, thereby producing a noise signal representing external sounds measured by the loudspeaker;
    a noise canceller operable to generate a signal for cancelling the noise signal; and
    a mixer operable to combine a source digital audio signal with the cancellation signal generated by the noise cancellation module and output the digital audio signal.

* * * * *